US012610661B2

(12) United States Patent
Lee et al.

(10) Patent No.: US 12,610,661 B2
(45) Date of Patent: Apr. 21, 2026

(54) LIGHT-EMITTING ELEMENT, METHOD OF ALIGNING THE SAME, AND DISPLAY DEVICE

(71) Applicant: Samsung Display Co., LTD., Yongin-si (KR)

(72) Inventors: Kang Young Lee, Seongnam-si (KR); Hyun Sup Lee, Seoul (KR); Moon Won Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 619 days.

(21) Appl. No.: 18/071,723

(22) Filed: Nov. 30, 2022

(65) Prior Publication Data

US 2023/0261136 A1    Aug. 17, 2023

(30) Foreign Application Priority Data

Feb. 16, 2022    (KR) ........................ 10-2022-0019913

(51) Int. Cl.
*H10H 20/819*    (2025.01)
*H10H 20/01*    (2025.01)
*H10H 20/81*    (2025.01)
*H10H 20/825*    (2025.01)
*H10H 29/14*    (2025.01)

(52) U.S. Cl.
CPC ...... *H10H 20/819* (2025.01); *H10H 20/0137* (2025.01); *H10H 20/81* (2025.01); *H10H 20/825* (2025.01); *H10H 29/142* (2025.01)

(58) Field of Classification Search
CPC .. H10H 20/819; H10H 20/825; H10H 29/142; H10H 20/83; H10H 20/84; H10H 20/831; H10H 20/821; H10D 86/451; H01L 25/0753
See application file for complete search history.

(56) References Cited

U.S. PATENT DOCUMENTS 11,935,986 B2    3/2024  Kim et al.
2012/0119237 A1*  5/2012  Leatherdale ......... H10H 29/142
257/E33.006

(Continued)

FOREIGN PATENT DOCUMENTS

KR        10-1436123        11/2014
KR     10-2016-0059576        5/2016

(Continued)

OTHER PUBLICATIONS

Kisik Im et al., "Lateral GaN nanowire prepared by using two-step TMAH wet etching and HfO2 sidewall spacer", Journal of Crystal Growth 441 (2016) 41-45.

*Primary Examiner* — Moazzam Hossain
(74) *Attorney, Agent, or Firm* — Womble Bond Dickinson (US) LLP

(57) ABSTRACT
A light-emitting element includes a core including a first semiconductor layer including a first portion and a second portion, the first and second portions having side surfaces at different inclinations, a second semiconductor layer disposed on the first semiconductor layer, and an emissive layer disposed between the first semiconductor layer and the second semiconductor layer; a first insulating layer surrounding the first portion of the first semiconductor layer; and a second insulating layer surrounding the second portion of the first semiconductor layer.

14 Claims, 16 Drawing Sheets

(56) References Cited

U.S. PATENT DOCUMENTS

| | | | | |
|---|---|---|---|---|
| 2012/0320445 | A1* | 12/2012 | Yang ...................... | G02B 5/201 |
| | | | | 359/290 |
| 2014/0145237 | A1* | 5/2014 | Do ....................... | H10H 20/813 |
| | | | | 438/34 |
| 2020/0388723 | A1* | 12/2020 | Ahmed ................ | H10H 20/833 |
| 2023/0307577 | A1 | 9/2023 | Lee et al. | |

FOREIGN PATENT DOCUMENTS

| | | |
|---|---|---|
| KR | 10-2087728 | 3/2020 |
| KR | 10-2020-0066438 A | 6/2020 |
| KR | 10-2021-0039321 | 4/2021 |
| KR | 10-2021-0149290 A | 12/2021 |
| KR | 10-2022-0040576 | 3/2022 |
| WO | 2021-246583 | 12/2021 |

* cited by examiner

ED: ED1, ED2, ED3

ED_1: ED1, ED2, ED3

ED_2: ED1, ED2, ED3

ED: ED1, ED2, ED3

ED: ED1, ED2, ED3

NDA

1

DA

DR1

DR2

DR3

ED1: ED1, ED2, ED3

ED1: ED1, ED2, ED3

LIGHT-EMITTING ELEMENT, METHOD OF ALIGNING THE SAME, AND DISPLAY DEVICE

CROSS REFERENCE TO RELATED APPLICATION(S)

This application claims priority to and benefits of Korean Patent Application No. 10-2022-0019913 under 35 U.S.C. § 119, filed on Feb. 16, 2022, in the Korean Intellectual Property Office (KIPO), the entire contents of which are incorporated herein by reference.

BACKGROUND

1. Technical Field

The disclosure relates to a light-emitting element, a method of aligning light-emitting elements, and a display device.

2. Description of the Related Art

As the information-oriented society evolves, various demands for display devices are ever increasing. Display devices may be flat panel display devices such as a liquid-crystal display device, a field emission display device, and a light-emitting display device. Light-emitting display devices may include an organic light-emitting display device including organic light-emitting diodes as the light-emitting elements; an inorganic light-emitting display device including inorganic semiconductor elements as the light-emitting elements, and a micro-LED display device including micro light-emitting diodes as the light-emitting elements.

SUMMARY

Aspects of the disclosure provide a light-emitting element with improved light-emitting efficiency, and a display device including the same.

Aspects of the disclosure also provide a light-emitting element that is aligned with an assembly substrate with a certain directionality and a method of aligning light-emitting elements.

It should be noted that objects of the disclosure are not limited to the above-mentioned object; and other objects of the disclosure will be apparent to those skilled in the art from the following descriptions.

According to the embodiments of the disclosure, a light-emitting element of a display device may have a multi-tapered shape including at least two portions having side surfaces at different inclinations each other, so that the light-emitting efficiency may be improved.

According to the embodiments of the disclosure, a light-emitting element including a multi-tapered shape may be aligned on the assembly substrate with a certain direction-ality, and thus the alignment accuracy may be improved.

It should be noted that effects of the disclosure are not limited to those described above and other effects of the disclosure will be apparent to those skilled in the art from the following descriptions.

According to an embodiment of the disclosure, a light-emitting element may include, a core including a first semiconductor layer including a first portion and a second portion, the first and second portions having side surfaces at different inclinations, a second semiconductor layer disposed on the first semiconductor layer, and an emissive layer disposed between the first semiconductor layer and the second semiconductor layer, a first insulating layer surrounding the first portion of the first semiconductor layer; and a second insulating layer surrounding the second portion of the first semiconductor layer.

In an embodiment, the core may be extended in a direction, the first portion of the first semiconductor layer may be extended parallel to the direction, and the second portion of the first semiconductor layer may be inclined with respect to the direction.

In an embodiment, the second insulating layer may surround an outer surface of the first insulating layer.

In an embodiment, the first insulating layer may directly contact the first portion of the first semiconductor layer, and the second insulating layer may directly contact the second portion of the first semiconductor layer.

In an embodiment, an inclination of a side surface of the second portion of the first semiconductor layer may be smaller than an inclination of a side surface of the first portion.

In an embodiment, a minimum diameter of the second portion of the first semiconductor layer may be smaller than a minimum diameter of the first portion.

In an embodiment, the second insulating layer may further surround the first portion of the first semiconductor layer, and an inclination of a side surface of the second insulating layer disposed on the first portion may be greater than an inclination of a side surface of the second insulating layer disposed on the second portion.

In an embodiment, the first semiconductor layer further may include a third portion and a fourth portion having side surfaces at different inclinations, and the second insulating layer may surround the third portion of the first semiconductor layer.

In an embodiment, an inclination of a side surface of the fourth portion of the first semiconductor layer may be smaller than an inclination of a side surface of the third portion.

In an embodiment, a minimum diameter of the fourth portion of the first semiconductor layer may be smaller than a minimum diameter of the third portion.

In an embodiment, a light-emitting element may further include a first element electrode disposed on the second semiconductor layer; and a second element electrode surrounding an upper surface and an outer surface of the first element electrode.

In an embodiment, a diameter of the second element electrode may be substantially equal to a diameter of the first insulating layer.

In an embodiment, an end of the first semiconductor layer may have a truncated cone shape.

In an embodiment, an end of the first semiconductor layer may have a cylindrical shape.

According to an embodiment of the disclosure a method of aligning light-emitting elements may comprise, preparing a substrate including holes having a first width; preparing light-emitting elements; and inserting the light-emitting elements into the holes of the substrate, wherein an end of each of the light-emitting elements may have a second width greater than the first width and another end of each of the light-emitting elements has the first width, and the light-emitting elements each including a first semiconductor layer, a second semiconductor layer disposed on the first semiconductor layer, and an emissive layer disposed between the first semiconductor layer and the second semiconductor layer.

In an embodiment, the inserting of the light-emitting elements into the holes of the substrate may include applying ink containing the light-emitting elements onto an upper surface of the substrate.

In an embodiment, the light-emitting elements may be aligned so that the end of each of the light-emitting elements may face in a direction opposite to flow of the ink in the holes.

In an embodiment, the inserting of the light-emitting elements into the holes of the substrate may include inserting the light-emitting elements so that the end of each of the light-emitting elements protrudes outward from a surface of the substrate and the another end of each of the light-emitting elements may be disposed in a corresponding one of the holes of the substrate.

In an embodiment, a width of the emissive layer of each of the light-emitting elements may be greater than the first width.

According to an embodiment of the disclosure, a display device may include, a substrate having holes; a light-emitting element partially disposed in the substrate and including a first semiconductor layer, a second semiconductor layer disposed on the first semiconductor layer, and an emissive layer disposed between the first semiconductor layer and the second semiconductor layer; and a common electrode electrically connected to the first semiconductor layer; and a pixel electrode electrically connected to the second semiconductor layer, wherein the light-emitting element may include an end protruding from the substrate, and a diameter of the end of the light-emitting element may be greater than a diameter of another end of the light-emitting element located in the substrate.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
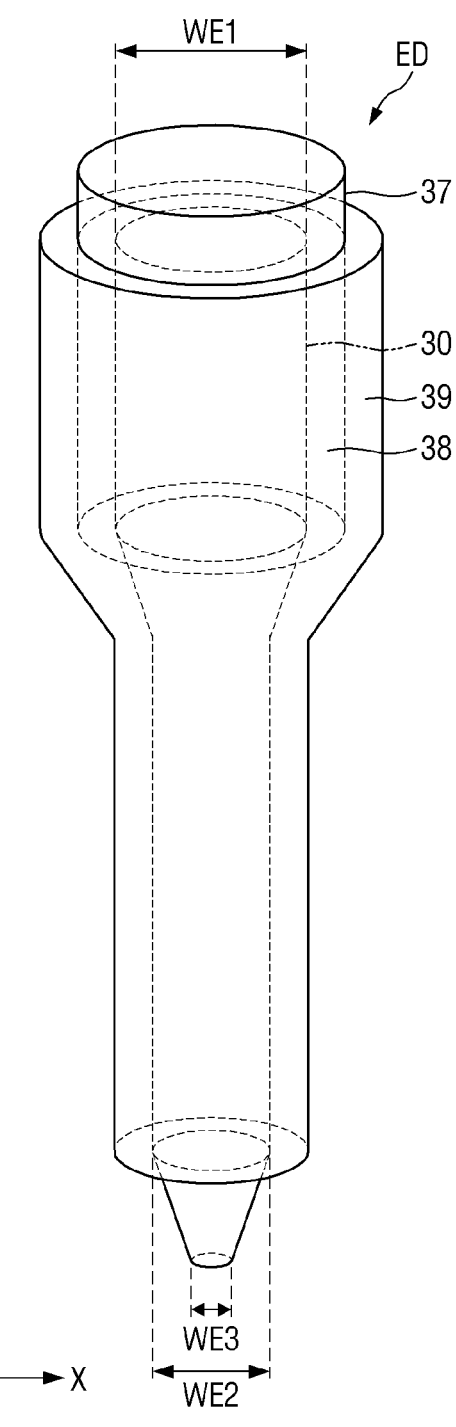
FIG. 1 is a schematic perspective view of a light-emitting element according to an embodiment of the disclosure.

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

Unless otherwise specified, the illustrated embodiments are to be understood as providing example features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and respective embodiments may be implemented independently of each other, or may be implemented together in association with each other.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Spatially relative terms, such as "beneath," "below," "under," "lower," "above," "on," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 2:
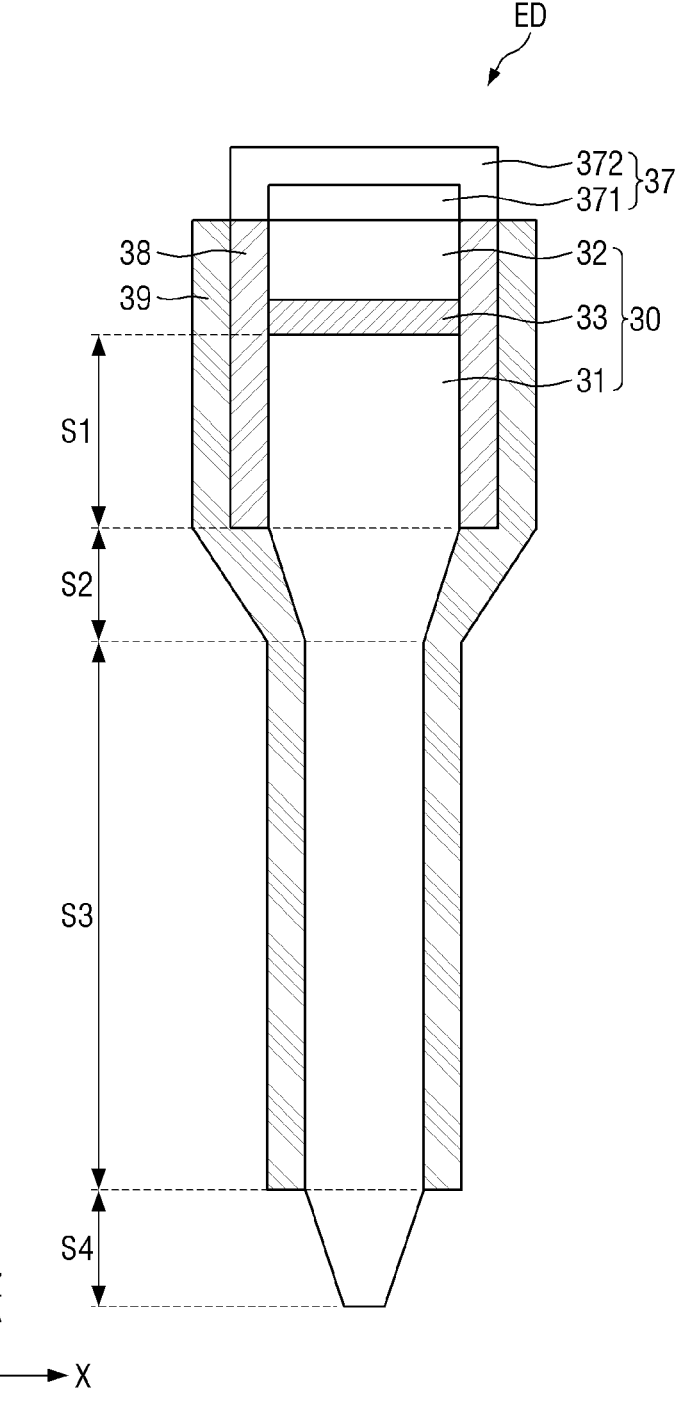
FIG. 2 is a schematic cross-sectional view showing the light-emitting element according to an embodiment of the disclosure.

FIG. 1 is a schematic perspective view of a light-emitting element according to an embodiment of the disclosure. FIG. 2 is a schematic cross-sectional view showing the light-emitting element according to the embodiment of the disclosure.

Referring to FIGS. 1 and 2, the light-emitting element ED may be a particulate element, and may have a rod or column shape having an aspect ratio (a predetermined or selectable aspect ratio). The light-emitting element ED may have a shape extended in a direction Z. A length of the light-emitting element ED in an extending direction (or longitudinal direction Z) may be greater than a diameter of the light-emitting element ED.

The light-emitting element ED may have a size of a nanometer scale (in a range of about 1 nm to about 1 μm) to a micrometer scale (in a range of about 1 μm to about 1 mm), and may be an inorganic light-emitting diode made of an inorganic material.

The light-emitting element ED according to an embodiment may be extended in the direction Z and may have an outer surface in a partially inclined shape. For example, the light-emitting element ED may have a shape of a cylinder, a rod, a wire, a tube, or the like, having outer surface partially inclined. For another example, the light-emitting element ED may have a polygonal column shape such as a cube, a cuboid, a hexagonal column, or the like.

According to an embodiment of the disclosure, the light-emitting element ED may be an inorganic light-emitting diode. The inorganic light-emitting diode may include semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, and the holes and electrons reaching the active semiconductor layer may be combined to emit light. Inorganic light-emitting diodes may be aligned between two electrodes facing each other as polarities are created by forming an electric field in a particular direction between the two electrodes.

The light-emitting element ED may include a core 30, an electrode layer 37 disposed on the core 30, and a first insulating layer 38 and a second insulating layer 39 surrounding a side surface of the core 30.

The core 30 may have a shape extended in the direction Z. The core 30 may include a first semiconductor layer 31, a second semiconductor layer 32, and an emissive layer 33. The core 30 may have a structure in which the layers are stacked on one another in the direction Z.

In the following description of the light-emitting elements ED according to the embodiments, "upper side" refers to a side of the core 30 in the direction Z where the electrode layer 37 is disposed, and "top surface" refers to a surface facing the side in the direction Z, unless specifically stated otherwise. The "lower side" refers to another side in the direction Z, and the "bottom surface" refers to a surface facing the another side in the direction Z.

The first semiconductor layer 31 may include a surface adjacent to the electrode layer 37, another surface distant from the electrode layer 37, and a side surface. In the drawings, a surface of the first semiconductor layer 31 may be referred to as an upper surface, and the another surface may be referred to as a lower surface.

The first semiconductor layer 31 may have a shape extended in the direction Z. In an embodiment, a side surface of the first semiconductor layer 31 may be inclined in the direction Z, or may be extended in the direction parallel to the direction Z. The first semiconductor layer 31 may include at least two portions, and the portions may have side surfaces at different inclinations (or inclination angles; hereinafter referred to as "inclinations"). The first semiconductor layer 31 may have a multi-tapered structure including at least two portions having side surfaces at different inclinations each other. The first semiconductor layer 31 may have different diameters at the different portions.

According to an embodiment of the disclosure, the first semiconductor layer 31 may include a first portion S1, a second portion S2, a third portion S3 and a fourth portion S4. The first portion S1 may include an upper surface of the first semiconductor layer 31 and may be located at a top of the first semiconductor layer 31. The fourth portion S4 may include a lower surface of the first semiconductor layer 31 and may be located at a bottom of the first semiconductor layer 31. The fourth portion S4, the third portion S3, the second portion S2 and the first portion S1 may be sequentially disposed in the direction Z. The first to fourth portions S1 to S4 may have side surfaces at different inclinations each other and may have different diameters each other.

The first portion S1 of the first semiconductor layer 31 may have a cylindrical shape in which a diameter of the upper surface may be substantially equal to a diameter of the lower surface. The first portion S1 may have a generally uniform diameter WE1 in the direction Z. The side surface of the first portion S1 of the first semiconductor layer 31 may be substantially parallel to the direction Z. The inclination of the side surface of the first portion S1 may form about 90° with respect to the upper surface of the first semiconductor layer 31.

The diameter of the upper surface of the second portion S2 of the first semiconductor layer 31 may be different from that of the lower surface. The diameter WE1 of the upper surface of the second portion S2 may be greater than the diameter WE2 of the lower surface, and the side surface may have an inclined shape. The side surface of the second portion S2 may be inclined at an acute angle with respect to the upper surface of the first semiconductor layer 31. The diameter of the second portion S2 may decrease from the upper surface to the lower surface. For example, the second portion S2 may have a truncated cone shape in which the diameter of the upper surface is greater than the diameter of the lower surface.

The third portion S3 of the first semiconductor layer 31 may have a cylindrical shape in which the diameter of the upper surface is substantially equal to the diameter of the lower surface, like the first portion S1. The second portion S2 may have a generally uniform diameter WE2 in the direction Z. The side surface of the third portion S3 of the first semiconductor layer 31 may be substantially parallel to the direction Z. The inclination of the side surface of the third portion S3 may form about 90° with respect to the upper surface of the first semiconductor layer 31.

The diameter of the upper surface of the fourth portion S4 of the first semiconductor layer 31 may be different from the diameter of the lower surface, like the second portion S2. The diameter WE2 of the upper surface of the fourth portion S4 may be greater than the diameter WE3 of the lower surface, and the side surface may have an inclined shape. The side surface of the fourth portion S4 may be inclined at an acute angle with respect to the upper surface of the first semiconductor layer 31. The diameter of the fourth portion S4 may decrease from the upper surface to the lower surface. For example, the fourth portion S4 may have a truncated cone shape in which the diameter of the upper surface is greater than the diameter of the lower surface.

The upper and lower surfaces of the first to fourth portions S1 to S4 may refer to imaginary surfaces at which the inclinations of the side surfaces are changed. For example, the upper surfaces and the lower surfaces of the portions may refer to imaginary surfaces, except for the upper surface of the first portion S1 that is the top of the first semiconductor layer 31 and the lower surface of the fourth portion S4 that is the bottom of the first semiconductor layer 31.

According to an embodiment of the disclosure, the side surfaces of the first to fourth portions S1 to S4 may have a substantially same inclination or different inclinations. An inclination of the side surface of the first portion S1 may be greater than the inclinations of the side surfaces of the second portion S2 and the fourth portion S4. The inclination of the side surface of the third portion S3 may be greater than the inclinations of the side surfaces of the second portion S2 and the fourth portion S4. The inclination of the side surface of the first portion S1 may be substantially equal to the inclination of the side surface of the third portion S3, but the disclosure is not limited thereto. The inclination of the side surface of the second portion S2 may be greater or less than the inclination of the side surface of the fourth portion S4, or may be substantially equal to it.

According to an embodiment of the disclosure, the upper surfaces or the lower surfaces of the first to fourth portions S1 to S4 may have a substantially same diameter or different diameters. The diameter WE1 of the first portion S1 may be substantially equal to the diameter WE1 of the upper surface of the second portion S2 (or the largest diameter), but may be greater than the diameter WE2 of the lower surface of the second portion S2 (or the smallest diameter). The diameter WE1 of the upper surface of the second portion S2 may be greater than the diameter WE2 of the third portion S3, and the diameter WE2 of the lower surface of the second portion S2 may be substantially equal to the diameter WE2 of the third portion S3. The diameter WE3 of the third portion S3 may be substantially equal to the diameter WE3 of the upper surface of the fourth portion S4 (or the largest diameter), but may be greater than the diameter WE3 of the lower surface of the fourth portion S4 (or the smallest diameter).

Although the third portion S3 is the longest while the second portion S2 or the fourth portion S4 is the shortest in the drawings, the disclosure is not limited thereto.

As will be described below, according to an embodiment, the first semiconductor layer 31 may have the multi-tapered structure in which the side surfaces have different inclinations each other, so that an area of the emissive layer 33 may be increased. A degree of vertical alignment of the light-emitting elements ED including the first semiconductor layer 31 may increase.

The first semiconductor layer 31 may be an n-type semiconductor. The first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be one or more of AlGaInN, GaN, AlGaN, InGaN, AlN and InN doped with n-type dopant. The n-type dopant doped into the first semiconductor layer 31 may be Si, Ge, Sn, Se, the like, or a combination thereof.

The first semiconductor layer 31 may occupy most of an area of the core 30 extended in the direction Z.

The second semiconductor layer 32 may be disposed above the first semiconductor layer 31 with the emissive layer 33 therebetween. The second semiconductor layer 32 may include a surface adjacent to the electrode layer 37, another surface distant from the electrode layer 37, and a side surface. In the drawings, a surface of the second semiconductor layer 32 may be referred to as an upper surface, and the another surface may be referred to as a lower surface.

The second semiconductor layer 32 may have a cylindrical shape in which a diameter of the upper surface is substantially equal to a diameter of the lower surface. The second semiconductor layer 32 may have a generally uniform diameter in the direction Z, and the diameter may be substantially equal to the diameter WE1 of the first portion S1 of the first semiconductor layer 31.

A length of the second semiconductor layer 32 may be smaller than a length of the first semiconductor layer 31.

The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of AlGaInN, GaN, AlGaN, InGaN, AlN and InN doped with p-type dopant. The p-type dopant doped into the second semiconductor layer 32 may be Mg, Zn, Ca, Ba, the like, or a combination thereof.

Although each of the first semiconductor layer 31 and the second semiconductor layer 32 is implemented as a signal layer in the drawings, the disclosure is not limited thereto. Depending on materials included in the emissive layer 33, the first semiconductor layer 31 and the second semiconductor layer 32 may further include a larger number of layers, e.g., a clad layer or a tensile strain barrier reducing (TSBR) layer.

The emissive layer 33 may be disposed between the first semiconductor layer 31 and the second semiconductor layer 32. The emissive layer 33 may include a material having a single or multiple quantum well structure. In case that the emissive layer 33 includes a material having the multiple quantum well structure, the structure may include quantum layers and well layers alternately stacked on one another. The emissive layer 33 may emit light as electron-hole pairs are combined therein in response to an electrical signal applied through the first semiconductor layer 31 and the second semiconductor layer 32. The emissive layer 33 may include a material such as AlGaN, AlGaInN, or InGaN. In case that the emissive layer 33 has a multi-quantum well structure in which quantum layers and well layers are alternately stacked on one another, the quantum layers may include AlGaN or AlGaInN, and the well layers may include a material such as GaN or AlGaN.

The emissive layer 33 may have a structure in which a semiconductor material having a large band gap energy and a semiconductor material having a small band gap energy are alternately stacked on one another, and may include other Group III to Group V semiconductor materials depending on a wavelength range of the emitted light. Accordingly, the light emitted from the emissive layer 33 is not limited to the light of the blue wavelength band. The emissive layer 36 may emit light of red or green wavelength band in some implementations.

The light emitted from the emissive layer 33 may exit not only through the end surfaces of the light-emitting element ED in the direction Z which is the longitudinal direction but also through the side surfaces of the light-emitting element ED. The direction in which the light emitted from the emissive layer 33 propagates is not limited to one direction.

The diameter of the emissive layer 33 may be substantially equal to the diameter WE1 of the first portion S1 of the first semiconductor layer 31. The diameter of the emissive layer 33 may be greater than the diameters WE2 or WE3 of the second to fourth portions S2 to S4 of the first semiconductor layer 31. In case that the diameter of the emissive layer 33 increases, the emission area may increase, and accordingly, a light-emitting efficiency of the light-emitting element ED may increase. According to this embodiment, since the diameter of the emissive layer 33 is larger than the width of the holes PH (see FIG. 4) of the substrate 100 (see FIG. 4) in a horizontal direction X, the emission area and light-emitting efficiency may be improved.

An end of the core 30 may be the upper surface of the second semiconductor layer 32, and another end thereof may be the lower surface of the first semiconductor layer 31. A diameter of the second semiconductor layer 32 may be substantially equal to the maximum diameter (i.e., WE1) of the first semiconductor layer 31 and may be larger than the minimum diameter (i.e., WE3) of the first semiconductor layer 31.

The electrode layer 37 may be disposed on the core 30. The electrode layers 37 may include a first electrode layer 371 and a second electrode layer 372.

The first electrode layer 371 may be disposed directly on the upper surface of the second semiconductor layer 32 of the core 30. It should be understood, however, that the disclosure is not limited thereto. Another semiconductor layer or electrode layer may be further disposed between the first electrode layer 371 and the second semiconductor layer 32. The first electrode layer 371 may have a columnar shape having the side surface parallel to the direction Z. The diameter of the first electrode layer 371 may be substantially equal to the diameter WE1 of the upper surface of the first semiconductor layer 31.

The first electrode layer 371 may be an ohmic connection electrode. It is, however, to be understood that the disclosure is not limited thereto. The electrode layer 37 may be a Schottky connection electrode.

The first electrode layer 371 may be disposed between the second semiconductor layer 32 and electrodes to reduce the resistance in case that the ends of the light-emitting element ED are electrically connected to the electrodes to apply electric signals to the first and second semiconductor layers 31 and 32. The first electrode layer 371 may include a metal having conductivity. For example, the first electrode layer 371 may include at least one of aluminum (Al), titanium (Ti), indium (In), gold (Au), silver (Ag), ITO, IZO ITZO, and the like.

The second electrode layer 372 may be disposed (e.g., disposed directly) on the upper surface of the first electrode layer 371. The second electrode layer 372 may completely cover the upper surface and the side surface of the first electrode layer 371. Accordingly, at least a part of the lower surface of the second electrode layer 372 may overlap the upper surface of the first insulating layer 38 in a plan view, and may directly contact it. Unlike the first electrode layer 371, the second electrode layer 372 may not directly contact the core 30.

The diameter of the upper surface of the second electrode layer 372 may be substantially equal to the diameter of the core 30 or the diameter WE1 of the first semiconductor layer 31.

Like the first electrode layer 371, the second electrode layer 372 may be an ohmic connection electrode or a Schottky connection electrode. The second electrode layer 372 may include a metal having conductivity, e.g., at least one of aluminum (Al), titanium (Ti), indium (In), gold (Au), silver (Ag), ITO, IZO ITZO, and the like.

The second electrode layer 372 may be formed before the second insulating layer 39 surrounding the outer surface of the first semiconductor layer 31 having the multi-tapered structure is formed. The second electrode layer 372 may protect the first insulating layer 38 during the process of fabricating the light-emitting element ED. Since the second electrode layer 372 covers the upper surface of the first insulating layer 38, it is possible to prevent the upper surface of the first insulating layer 38 from being etched while the second insulating layer 39 is formed and etched.

The first insulating layer 38 may be disposed to surround the side surface (or an outer circumferential surface) of the core 30. The first insulating layer 38 may be disposed to surround the side surfaces of the first semiconductor layer 31, the emissive layer 33 and the second semiconductor layer 32 of the core 30, and may be extended in the direction Z in which the core 30 is extended. The first insulating layer 38 may contact (e.g., contact directly) the side surfaces of the first semiconductor layer 31, the emissive layer 33 and the second semiconductor layer 32 of the core 30.

The first insulating layer 38 may surround a part of the first semiconductor layer 31, and may not be disposed on a remaining part. For example, the first insulating layer 38 may be disposed to surround the side surface of the first portion S1 of the first semiconductor layer 31, but may not be disposed on the side surfaces of the second to fourth portions S2 to S4. The first insulating layer 38 may expose the first electrode layer 371. Accordingly, the second to fourth portions S2 to S4 of the first semiconductor layer 31 and the first electrode layer 371 may be exposed by the first insulating layer 38.

The first insulating layer 38 may protect the first semiconductor layer 31, the second semiconductor layer 32 and the emissive layer 33 of the core 30. The first insulating layer 38 may protect the first portion S1 of the first semiconductor layer 31. Since the first insulating layer 38 is disposed to surround the first portion S1, the second to fourth portions S2 to S4 may be grown up from the second to fourth portions S2 to S4 more stably.

The first insulating layer 38 may include a material having insulating properties, e.g., aluminum oxide ($Al_2O_3$), silicon oxide (SiOx), silicon nitride (SiNx), hafnium oxide (HfOx), the like, or a combination thereof. The first insulating layer 38 may be made up of a single film including the above-described material or a multilayer structure in which these are stacked on one another.

The second insulating layer 39 may surround the side surface of the first insulating layer 38 of the core 30. The second insulating layer 39 may be disposed to surround the side surfaces of the first semiconductor layer 31, the emissive layer 33 and the second semiconductor layer 32 of the core 30, and may be extended in the direction Z in which the core 30 is extended.

The second insulating layer 39 may surround the side surfaces of the other portions grown from the first portion S1 of the first semiconductor layer 31. For example, the second insulating layer 39 may be disposed to surround the side surfaces of the first portion S1, the second portion S2 and the third portion S3 of the first semiconductor layer 31. The second insulating layer 39 may be disposed on the side surfaces of the first portion S1 of the first semiconductor layer 31, the emissive layer 33 and the second semiconductor layer 32 with the first insulating layer 38 therebetween, so that they may not contact directly them. The second insulating layer 39 may directly contact the second portion S2 and the third portion S3 of the first semiconductor layer 31.

The second insulating layer 39 may surround a part of the first semiconductor layer 31, and may not be disposed on a remaining part. For example, the second insulating layer 39 may be disposed to surround the side surfaces of the first portion S1, the second portion S2 and the third portion S3 of the first semiconductor layer 31 but may not be disposed on the side surface of the fourth portion S4. The second insulating layer 39 may expose the first electrode layer 371 and the second electrode layer 372. Accordingly, the fourth portion S4 of the first semiconductor layer 31 and the electrode layers 371 and 372 may be exposed by the second insulating layer 39.

The second insulating layer 39 may protect the other portions of the first semiconductor layer 31 grown from the first portion S1 of the first semiconductor layer 31. For example, the second insulating layer 39 may protect the first portion S1, the second portion S2, and the third portion S3 of the first semiconductor layer 31.

The second insulating layer 39 may include a material having insulating properties, e.g., aluminum oxide ($Al_2O_3$), silicon oxide (SiOx), silicon nitride (SiNx), hafnium oxide (HfOx), the like, or a combination thereof. The second insulating layer 39 may have a single film including the above-described material or a multilayer structure in which these are stacked on one another.

The side surfaces of the first insulating layer 38 and the second insulating layer 39 each may have an inclination corresponding to the side surface of the core 30. For example, the first insulating layer 38 surrounds the side surfaces of the first portion S1 of the first semiconductor layer 31, the emissive layer 33 and the second semiconductor layer 32 in a columnar shape, the side surface of the first insulating layer 38 may be substantially parallel to the direction Z. Since the second insulating layer 39 surrounds the side surfaces of the first to third portions S1 to S3 of the first semiconductor layer 31, the emissive layer 33 and the second semiconductor layer 32, the side surface of the second insulating layer 39 may have a shape inclined multiple times.

According to an embodiment of the disclosure, as the core 30 has the multi-tapered shape including at least two portions having the side surfaces at different inclinations each other, they may be vertically aligned in a desired direction in an alignment substrate (or substrate 100) to be described below. Since the emissive layer 33 of the core 30 has a width greater than the width (or diameter) of the holes of the alignment substrate, a light-emitting efficiency may increase according to an increase in the emission area of the emissive layer 33.

Figure 3:
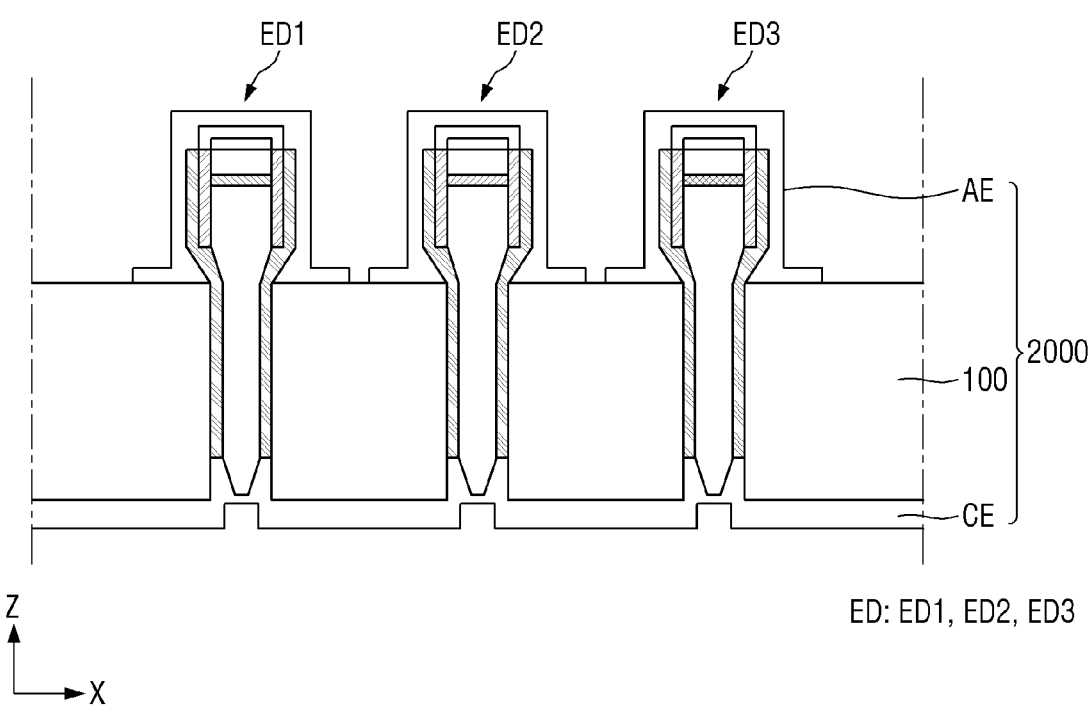
FIG. 3 is a schematic cross-sectional view of a display substrate including light-emitting elements according to an embodiment.
Figure 4:
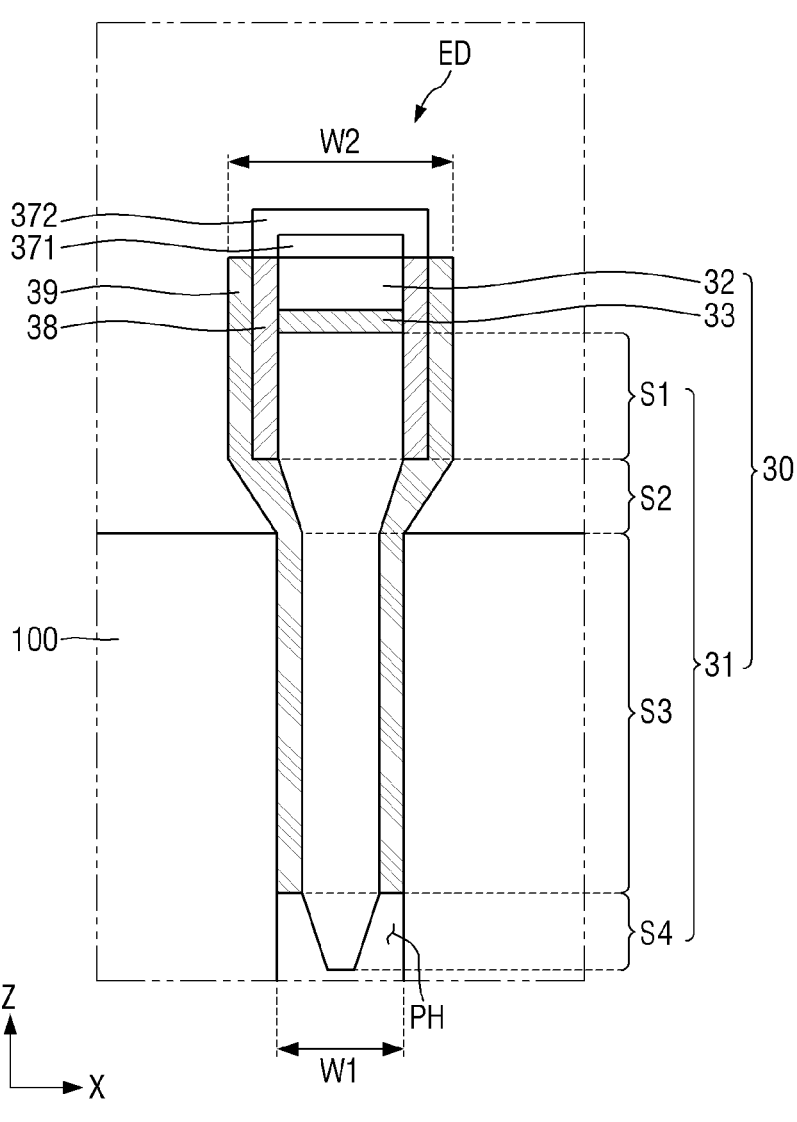
FIG. 4 is a schematic enlarged cross-sectional view of the light-emitting elements and a substrate of FIG. 3.

FIG. 3 is a schematic cross-sectional view of a display substrate including light-emitting elements according to an embodiment. FIG. 4 is a schematic enlarged cross-sectional view of the light-emitting elements and the substrate of FIG. 3.

FIGS. 3 and 4 show a display substrate 2000 in which light-emitting elements ED according to an embodiment are vertically aligned in the holes of the substrate 100.

The display substrate 2000 may include the substrate 100, the light-emitting elements ED, pixel electrodes AE, and a common electrode CE.

The substrate 100 may be an assembly substrate or an alignment substrate having holes PH formed in a direction Z to fix the light-emitting elements ED inserted into the holes PH. The holes PH of the substrate 100 may be through holes penetrating the substrate 100 to expose the inner surface of the substrate 100. The widths of the holes PH may vary depending on the width (or diameter) of the light-emitting elements ED to be inserted. For example, the holes PH may be formed to have a size substantially equal to the shape and size of the light-emitting elements ED so that the inserted light-emitting elements ED are supported and fixed. For example, the holes PH may have a width corresponding to the width of the light-emitting elements ED.

The substrate 100 may use a polymer material such as polyimide (PI) or the like. It should be understood, however, that the disclosure is not limited thereto. The substrate 100 may include a transparent material such as sapphire $Al_2O_3$ and glass, or a semiconductor material such as GaN or the like.

The light-emitting elements ED may have a multi-tapered structure corresponding to the core 30. The light-emitting elements ED may be vertically inserted into the holes PH of the substrate 100 with bias or biased directionality by virtue of the multi-tapered structure. As used herein, the bias or the biased directionality refers to a property of being biased toward a particular direction. For example, the light-emitting elements ED may be aligned in the substrate 100 such that the second electrode layer 372 of each of the light-emitting elements ED faces the upper surface and the first semiconductor layer 31 faces the lower surface. In this instance, an end of each of the light-emitting elements ED aligned with the substrate 100 may be an upper surface of the second electrode layer 372, and another end thereof may be a lower surface of the first semiconductor layer 31.

Since the light-emitting elements ED have a multi-tapered structure, at least a part of the light-emitting elements ED may have a first width W1 substantially equal to the width of the holes PH, and at least the other part may have a second width W2 greater than the width of the holes PH. The part having the width substantially equal to or smaller than the width of the holes PH may be vertically inserted into the holes PH of the substrate 100, and the other part having the width greater than the width of the holes PH may protrude from the substrate 100. For example, the first width W1 of the light-emitting elements ED may correspond to the diameter of the third portion S3 of the first semiconductor layer 31 and the second insulating layer 39 surrounding it. The second width W2 of the light-emitting elements ED may be substantially equal to the diameter of the first portion S1 larger than the third portion S3 of the first semiconductor layer 31 and the diameters of the insulating films 38 and 39 surrounding the first portion S1.

In a process of aligning the light-emitting elements ED, which will be described below, the light-emitting elements ED may be contained in ink 150 (see FIG. 11) and may be aligned in the substrate 100. If there is a fluid flow in the ink 150, the light-emitting elements ED may be aligned such that a part having a larger surface area faces in the opposite direction to the fluid flow. For example, if there is a fluid flow of the ink 150 in a first direction D1 (downward direction in FIG. 11) because of a pressure difference between the ink 150 and a chamber 200 (see FIG. 11), the part of the light-emitting element ED having a larger surface area may be biased in a second direction D2 (upward direction in FIG. 11). According to an embodiment of the disclosure, the end of each of the light-emitting elements ED having the second width W2 may have a larger surface area than the opposite end having the first width W1. Accordingly, the light-emitting elements ED may be aligned such that the second electrode layer 372 faces the upper surface and the first semiconductor layer 31 faces the lower surface.

The light-emitting elements ED according to this embodiment may be vertically aligned in the substrate 100 with a biased directionality. Alignment accuracy of the light-emitting elements ED aligned in the substrate 100 may increase.

According to an embodiment of the disclosure, the light-emitting elements ED may include a first light-emitting element ED1, a second light-emitting element ED2 and a third light-emitting element ED3 which have different emissive layers 33. The emissive layer of the first light-emitting element ED1 may include a different material from the emissive layers of the second and third light-emitting elements ED2 and ED3. For example, the emissive layer of the first light-emitting element ED1 emitting red light may include GaAs or the like, and the emissive layer of the second light-emitting element ED2 emitting green light or the emissive layer of the third light-emitting element ED3 emit blue light may include GaN or the like.

As an area of the emissive layer 33 of the light-emitting elements ED increases, an emission area of the light-emit-ting elements ED may increase. Thus, the light-emitting efficiency of the light-emitting elements ED may increase. According to an embodiment of the disclosure, the light-emitting elements ED may have a minimum width for being stably inserted into the holes PH at least partially, and the area of the emissive layer 33 may increase to a maximum. As a result, the light-emitting efficiency of the light-emitting elements ED may increase.

For example, an end of each of the light-emitting elements ED may protrude outward from an upper surface of the substrate 100, while another end thereof may be disposed inside the holes PH of the substrate 100. The first portion S2 and the second portion S2 of the first semiconductor layer 31, the emissive layer 33, the second semiconductor layer 32, the first electrode layer 371 and the second electrode layer 372 of the light-emitting element ED may protrude outward from the upper surface of the substrate 100. The third portion S3 and the fourth portion S4 of the first semiconductor layer 31 of each of the light-emitting elements ED may be stably inserted into the corresponding one of the holes PH of the substrate 100. Accordingly, the width (or diameter) of the emissive layers 33 of the light-emitting elements ED may be increased to improve light-emitting efficiency regardless of the width of the holes PH.

It should be understood, however, that the disclosure is not limited thereto. The other ends of the light-emitting elements ED may protrude outward from the lower surface of the substrate 100.

The pixel electrodes AE may be electrically connected to the light-emitting elements ED. The pixel electrodes AE may be connected to the light-emitting elements ED. The pixel electrodes AE may be discretely disposed on the second electrode layers 372 that are the upper surfaces of the light-emitting elements ED. The pixel electrodes AE may receive an anode voltage from the semiconductor circuit board, and may provide it to the second semiconductor layers 32 of the light-emitting elements ED. The pixel electrodes AE may include a metal material such as aluminum (Al) or the like.

Although the pixel electrodes AE cover the side surfaces of the light-emitting elements ED and parts of the substrate 100 in the drawings, but the disclosure is not limited thereto. For example, the pixel electrodes AE may contact the upper surface of the second electrode layers 372.

A common electrode CE may be electrically connected to the light-emitting elements ED, and may be continuously extended throughout an entire surface of the light-emitting elements ED. The common electrode CE may be connected to the first semiconductor layer 31 that is a bottom surface of the light-emitting elements ED. The common electrode CE may be disposed at a lower surface of the substrate 100 and may be disposed in a portion of the holes PH not filled with the light-emitting elements ED. The common electrode CE may receive a cathode voltage to provide it to the first semiconductor layer 31 of each of the light-emitting elements ED.

Hereinafter, a light-emitting element and a display substrate including the same according to other embodiments will be described.

Figure 5:
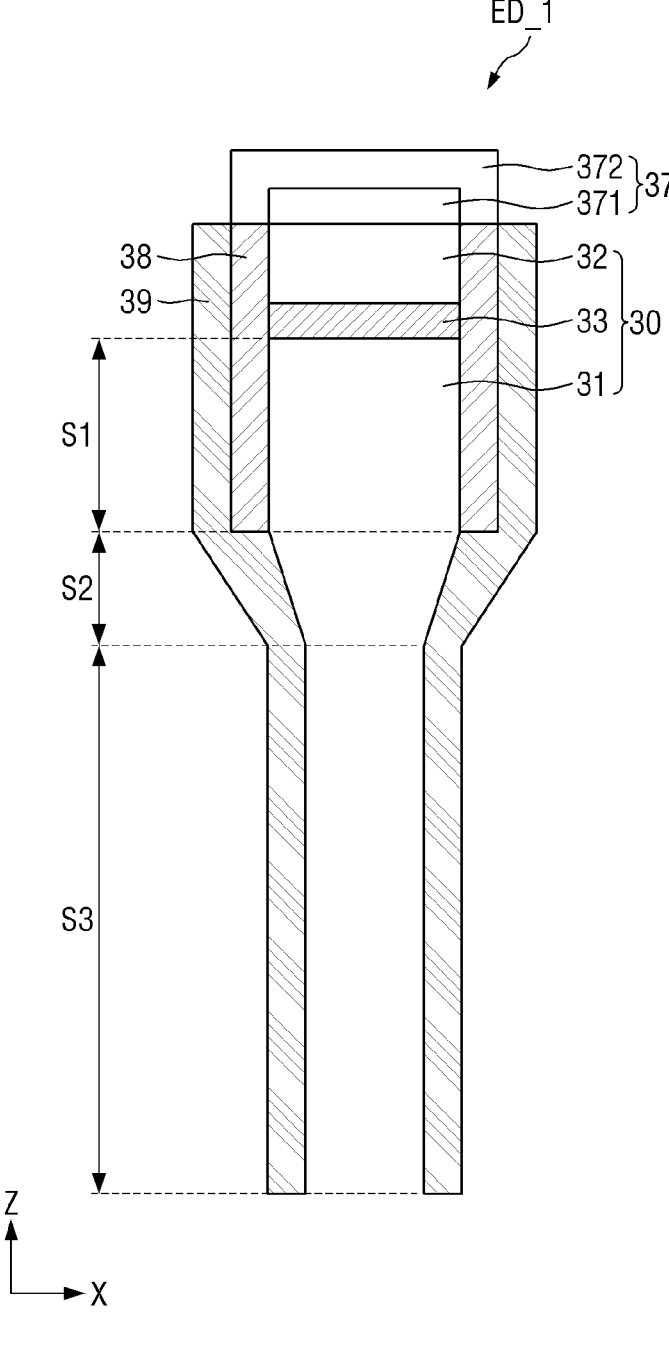
FIG. 5 is a schematic cross-sectional view showing a light-emitting element according to another embodiment of the disclosure.
Figure 6:
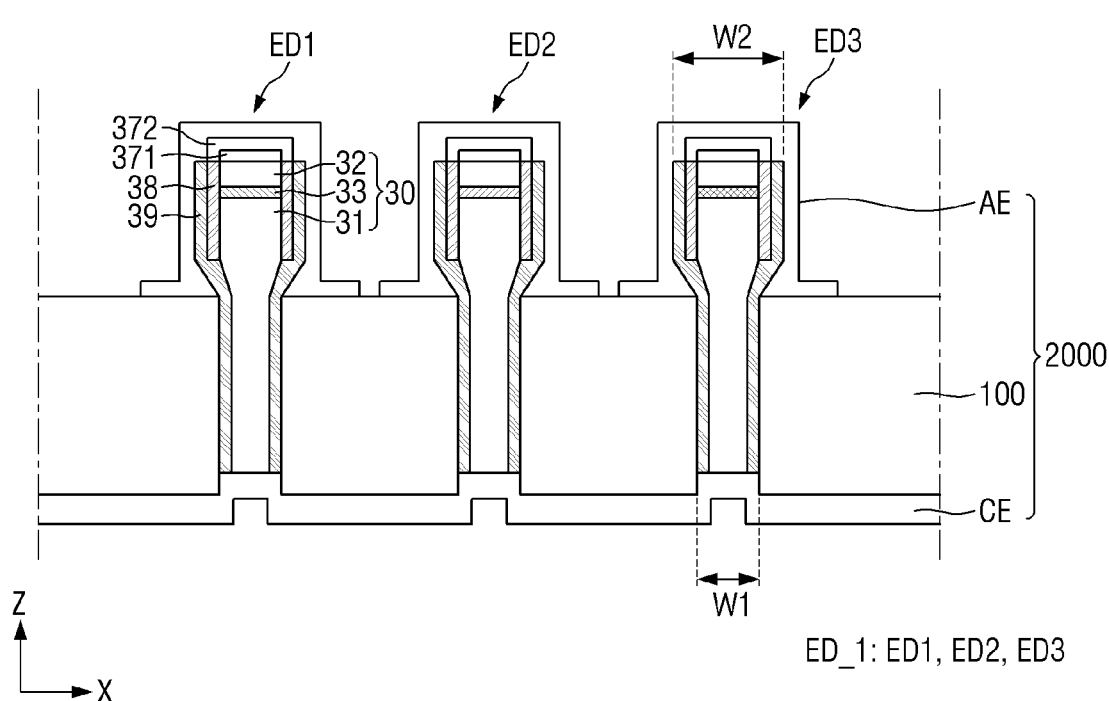
FIG. 6 is a schematic cross-sectional view of a display substrate including a light-emitting element of FIG. 5.

FIG. 5 is a schematic cross-sectional view showing a light-emitting element according to another embodiment of the disclosure. FIG. 6 is a schematic cross-sectional view of a display substrate including the light-emitting element of FIG. 5.

This embodiment may be different from the above-described embodiment in that a first semiconductor layer 31 of a light-emitting element ED_1 may not include a fourth portion S4. The first semiconductor layer 31 may include a first portion S1, a second portion S2 and a third portion S3, and has a multi-tapered structure having side surfaces at different inclinations and diameters each other, like in the above-described embodiment.

An end of the first semiconductor layer 31 may be an upper surface of the first portion S1 of the first semiconductor layer 31, and another end thereof may be a lower surface of the third portion S3 of the first semiconductor layer 31. Since the third portion S3 has a cylindrical shape having a side surface parallel to the direction Z, a diameter of the third portion S3 may be constant. Although not shown in the drawings, the light-emitting element ED_1 may include a diameter WE1 of the first portion S1, a maximum diameter WE1 and a minimum diameter WE2 of the second portion S2, and a diameter WE3 of the third portion S3.

The second insulating layer 39 surrounding the third portion S3 of the first semiconductor layer 31 may be disposed to completely surround the another end of the light-emitting element ED_1. It should be understood, however, that the disclosure is not limited thereto. The second insulating layer 39 may be disposed to expose a part of the third portion S3, like the second electrode layer 372.

Referring to FIG. 6, light-emitting elements ED_1 may be vertically aligned in holes PH of a substrate 100, as in the above-described embodiment. Since a first width W1 of the bottom surface that is the another end of each of the light-emitting elements ED_1 is substantially equal to the width of the holes PH, the light-emitting elements ED_1 may be stably inserted into the substrate 100. Since a second width W2 of the top surface that is an end of each of the light-emitting elements ED_1 is greater than the width of the holes PH, it may be not inserted into the substrate 100 but may protrude from the upper surface of the substrate 100.

The light-emitting elements ED_1 according to the embodiment have a multi-tapered structure, and thus may be inserted into the substrate 100 with a biased directivity. The light-emitting elements ED_1 may have a biased directivity such that the second electrode layer 372 faces the upper surface and the first semiconductor layer 31 faces the lower surface. Accordingly, a degree of integration of the display substrate 2000 including the light-emitting elements ED_1 may be improved.

As the light-emitting elements ED_1 according to the embodiment have a multi-taper structure, at least a part thereof may be stably aligned in the holes PH of the substrate 100, and the part including the emissive layer 33 may increase the diameter (or width) to increase light-emitting efficiency. Accordingly, an emission area and a light-emitting efficiency of the light-emitting elements ED_1 may increase.

Figure 7:
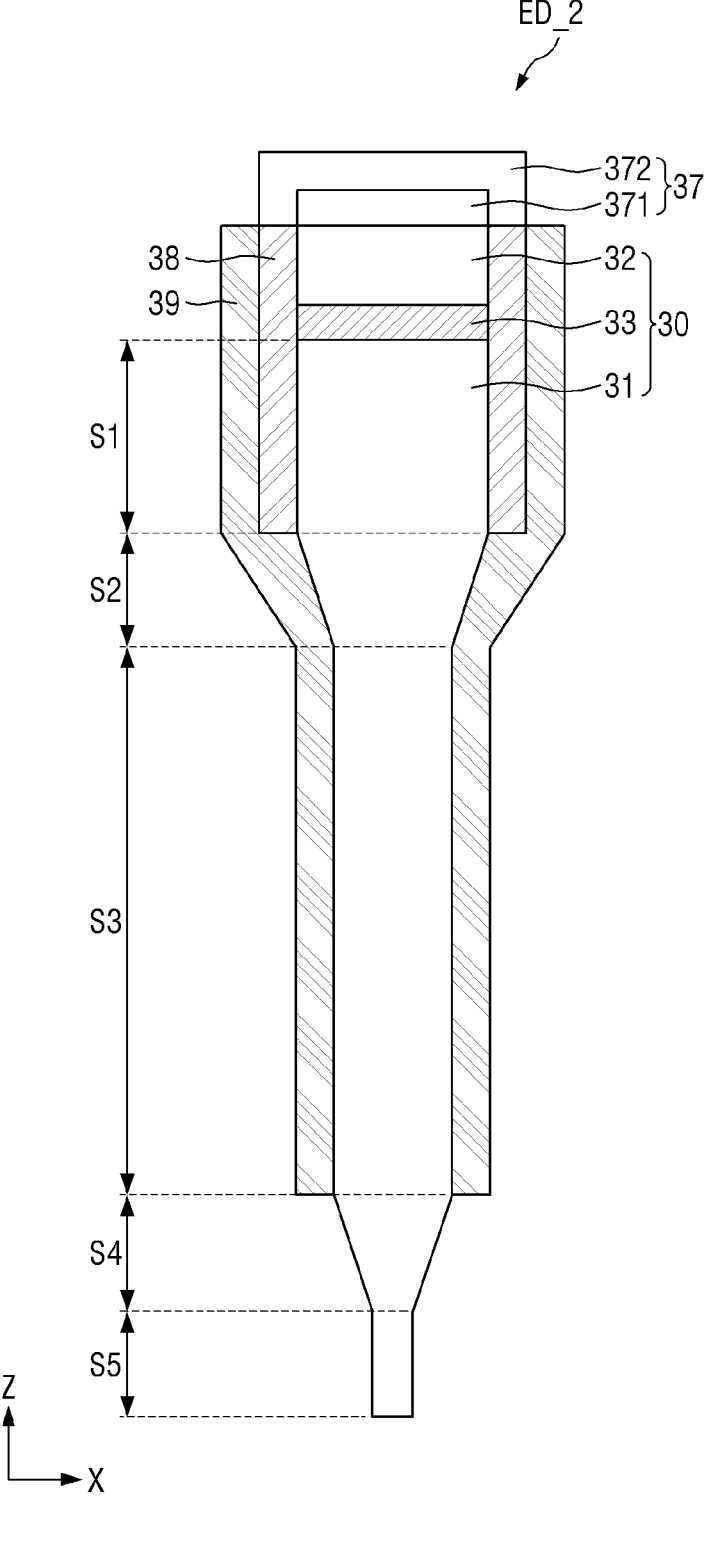
FIG. 7 is a schematic cross-sectional view of a light-emitting element according to another embodiment of the disclosure.
Figure 8:
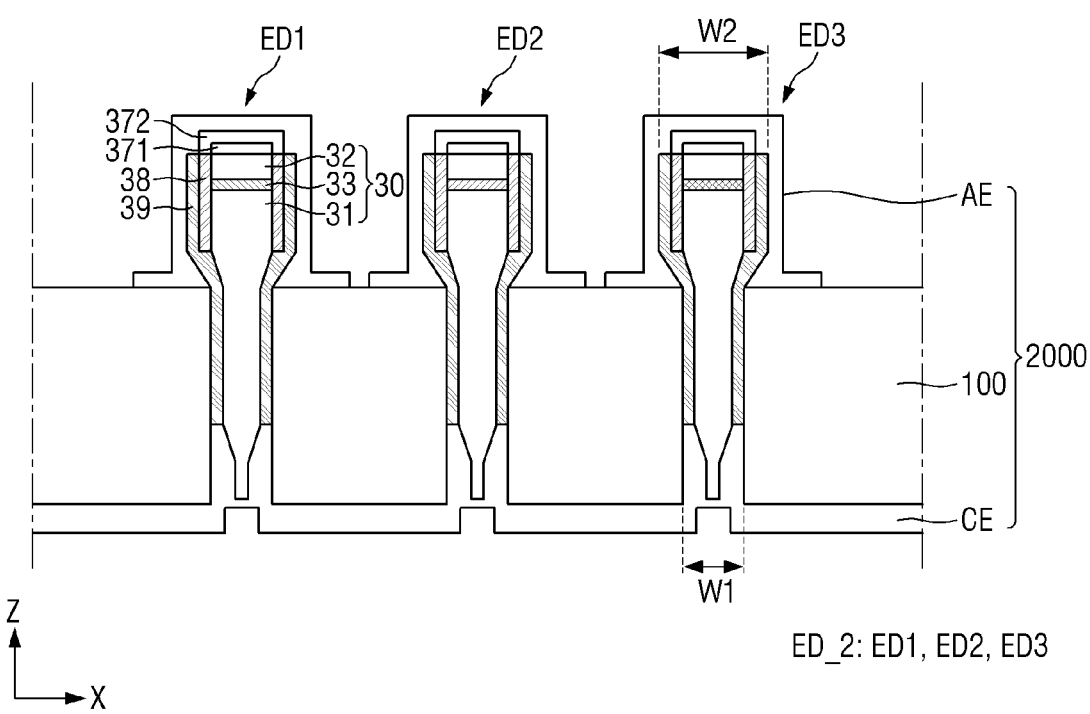
FIG. 8 is a schematic cross-sectional view of a display substrate including the light-emitting element of FIG. 7.

FIG. 7 is a schematic cross-sectional view of a light-emitting element according to another embodiment of the disclosure. FIG. 8 is a schematic cross-sectional view of a display substrate including the light-emitting element of FIG. 7.

This embodiment may be different from the above-described embodiment in that a first semiconductor layer 31 of a light-emitting element ED_2 further includes a fifth portion S5. Since the first semiconductor layer 31 includes the first to fifth portions S1 to S5, a diversity of inclinations of side surfaces may increase.

Since the first to fourth portions S1 to S4 are identical to the first to fourth portions S1 to S4 of the light-emitting elements ED according to the above-described embodiment, the redundant descriptions will be omitted.

An end of the first semiconductor layer 31 may be an upper surface of the first portion S1 of the first semiconductor layer 31, and another end thereof may be a lower surface of the fifth portion S5 of the first semiconductor layer 31.

The fifth portion S5 may have a cylindrical shape in which the diameter of the upper surface is substantially equal to the diameter of the lower surface. The fifth portion S5 may have a generally uniform diameter in the direction Z. For example, although not shown in the drawings, the diameter of the fifth portion S5 may be substantially equal to a minimum diameter WE3 of the fourth portion S4. A side surface of the fifth portion S5 of the first semiconductor layer 31 may be substantially parallel to the direction Z. An inclination of the side surface of the fifth portion S5 may be about 90° to the upper surface of the first semiconductor layer 31.

The first insulating layer 38 may surround side surfaces of the second semiconductor layer 32, an emissive layer 33 and the first portion S1 of the first semiconductor layer 31.

The second insulating layer 39 may be disposed to surround side surfaces of the first insulating layer 38, the second semiconductor layer 32, the emissive layer 33, and the first portion S1, the second portion S2 and the third portion S3 of the first semiconductor layer 31. The second insulating layer 39 may be disposed to expose a first electrode layer 371, a second electrode 372, and the fourth portion S4 and the fifth portion S5 of the first semiconductor layer 31.

Referring to FIG. 8, light-emitting elements ED_2 may be vertically aligned in holes PH of a substrate 100, as in the above-described embodiment. Since a first width W1 of a bottom surface that is another end of each of the light-emitting elements ED_2 is substantially equal to a width of the holes PH, the light-emitting elements ED_2 may be stably inserted into the substrate 100. Since a second width W2 of the top surface that is an end of each of the light-emitting elements ED_2 is greater than the width of the holes PH, it may be not inserted into the substrate 100 but may protrude from an upper surface of the substrate 100.

The light-emitting elements ED_2 according to the embodiment may have a multi-tapered structure, and thus may be inserted into the substrate 100 with a biased directivity. The light-emitting elements ED_2 may have a biased directivity such that the second electrode layer 372 faces the upper surface and the first semiconductor layer 31 faces the lower surface. Accordingly, a degree of integration of the display substrate 2000 including the light-emitting elements ED_2 may be improved.

As light-emitting elements ED_3 according to the embodiment have the multi-taper structure, at least a part thereof may be stably aligned in the holes PH of the substrate 100, and the part including the emissive layer 33 may increase the diameter (or width) to increase light-emitting efficiency. Accordingly, an emission area and light-emitting efficiency of the light-emitting elements ED_2 may increase.

Figure 9:
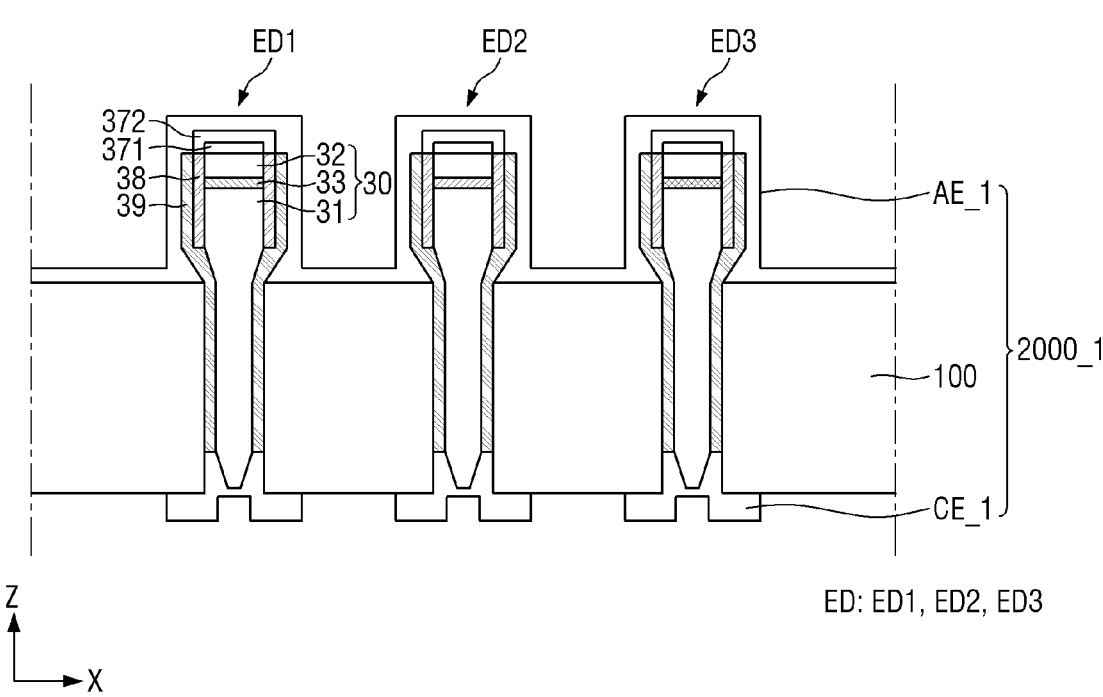
FIG. 9 is a schematic cross-sectional view of a display substrate according to another embodiment of the disclosure.

FIG. 9 is a schematic cross-sectional view of a display substrate according to another embodiment of the disclosure.

This embodiment may be different from the above-described embodiments in that a display substrate 2000_1 includes a pixel electrode AE_1 disposed across light-emitting elements ED and common electrodes CE_1 associated with the light-emitting elements ED.

A pixel electrode AE_1 may be connected to a second electrode layer 372 of the light-emitting elements ED across the different light-emitting elements ED, and a voltage (e.g., a predetermined or selectable voltage) may be applied to the second electrode layer 372. The voltage may be an anode voltage or a cathode voltage.

The common electrode CE_1 may be discretely disposed in each of the light-emitting elements ED. The common electrode CE_1 may be connected to a first semiconductor layer 31 to apply a voltage to the first semiconductor layer 31. The voltage may be an anode voltage or a cathode voltage.

FIGS. 10 to 13 are schematic cross-sectional views for illustrating a method of aligning light-emitting elements according to an embodiment.

The method of aligning the light-emitting elements ED according to an embodiment may include preparing a substrate 100 including holes PH; ejecting ink 150 onto the substrate 100 seated on a chamber 200; aligning the light-emitting elements ED in the holes PH of the substrate 100; and cleaning out the ink 150 once the light-emitting elements ED have been aligned.

Figure 10:
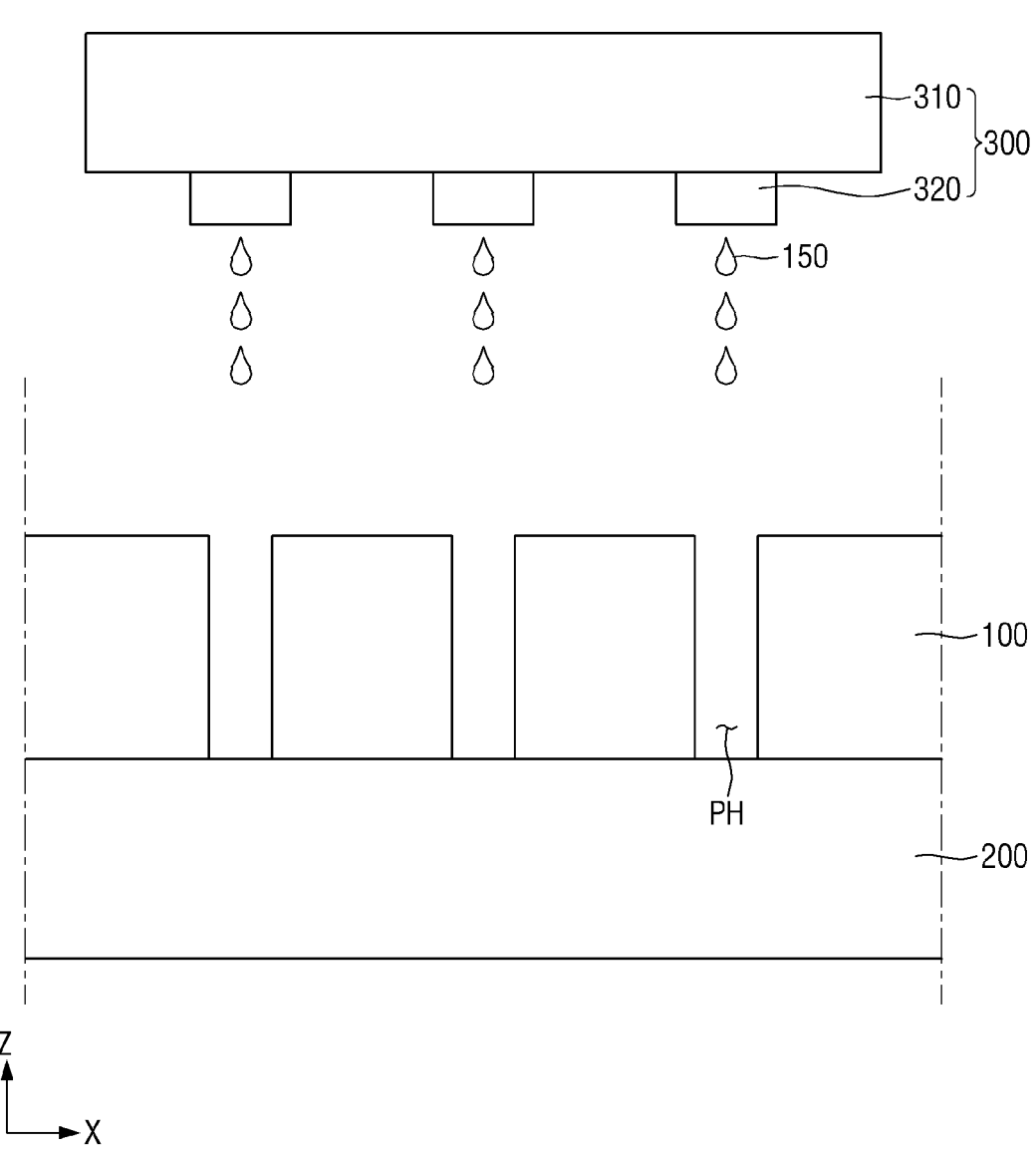
FIGS. 10 to 13 are schematic cross-sectional views for illustrating a method of aligning light-emitting elements according to an embodiment.

Initially, referring to FIG. 10, the substrate 100 including the holes PH may be prepared, and the ink 150 may be sprayed onto the substrate 100 seated on the chamber 200.

The substrate 100 may include the holes PH formed in a direction Z or thickness direction of the substrate 100. The holes PH may penetrate the substrate 100 to expose an inner surface of the substrate 100.

The substrate 100 may be seated on the chamber 200, and an ink-jet apparatus 300 may be positioned to face an upper side of the substrate 100. The ink-jet apparatus 300 may eject the ink 150 containing the light-emitting elements ED onto the upper surface of the substrate 100. Accordingly, the ink 150 containing the light-emitting elements ED may be applied to the upper surface of the substrate 100.

The ink-jet apparatus 300 may include an inkjet head unit 310 and an inkjet nozzle unit 320. The ink-jet apparatus 300 may eject ink 150 onto a target substrate 100 seated on the chamber 200 using the inkjet head unit 310 and the inkjet nozzle unit 320.

The chamber 200 may generate a pressure difference between the upper and lower sides of the substrate 100 to assemble the light-emitting elements ED in the substrate 100. The chamber 200 may suck the ink 150 through the holes PH from the lower side of the substrate 100, thereby forming a pressure difference between the upper side and the lower side of the substrate 100.

Figure 11:
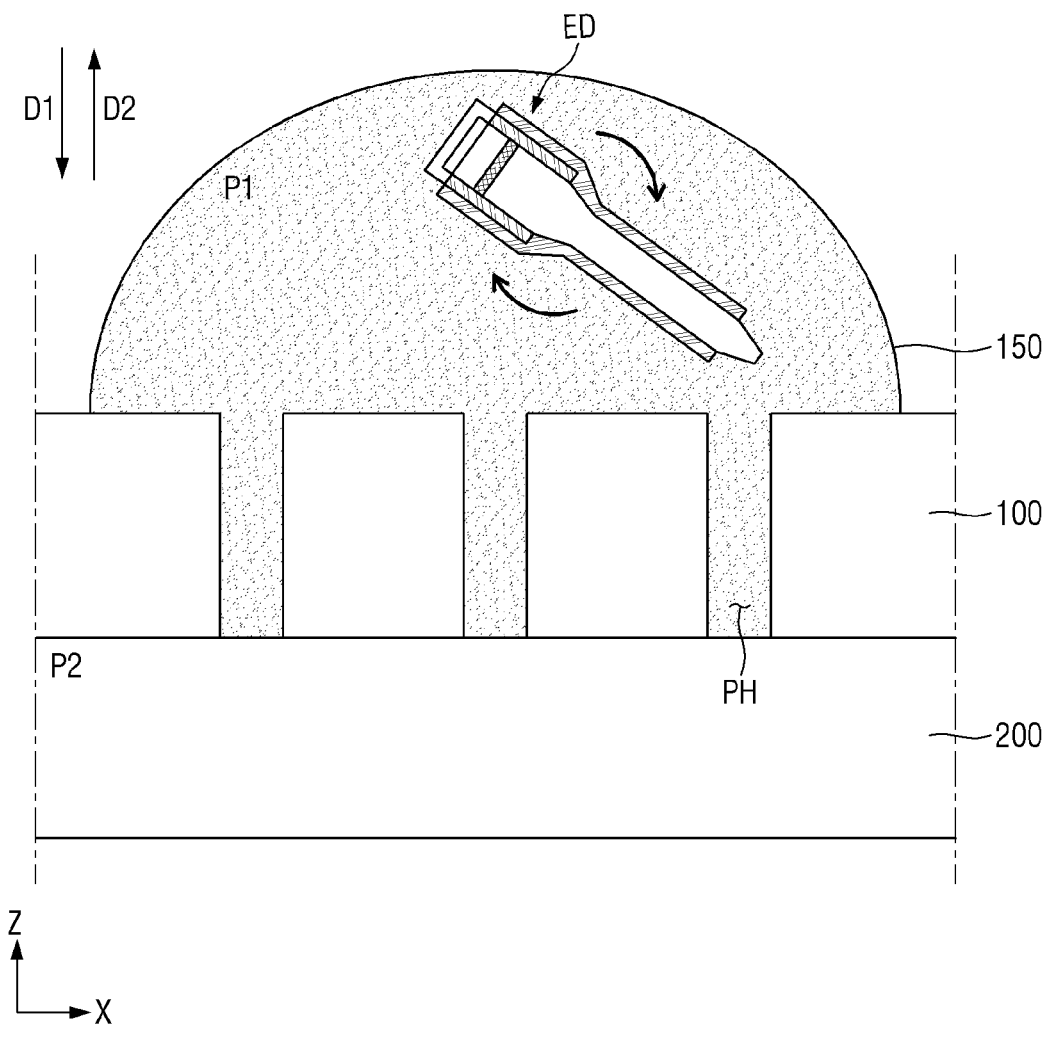
Figure 12:
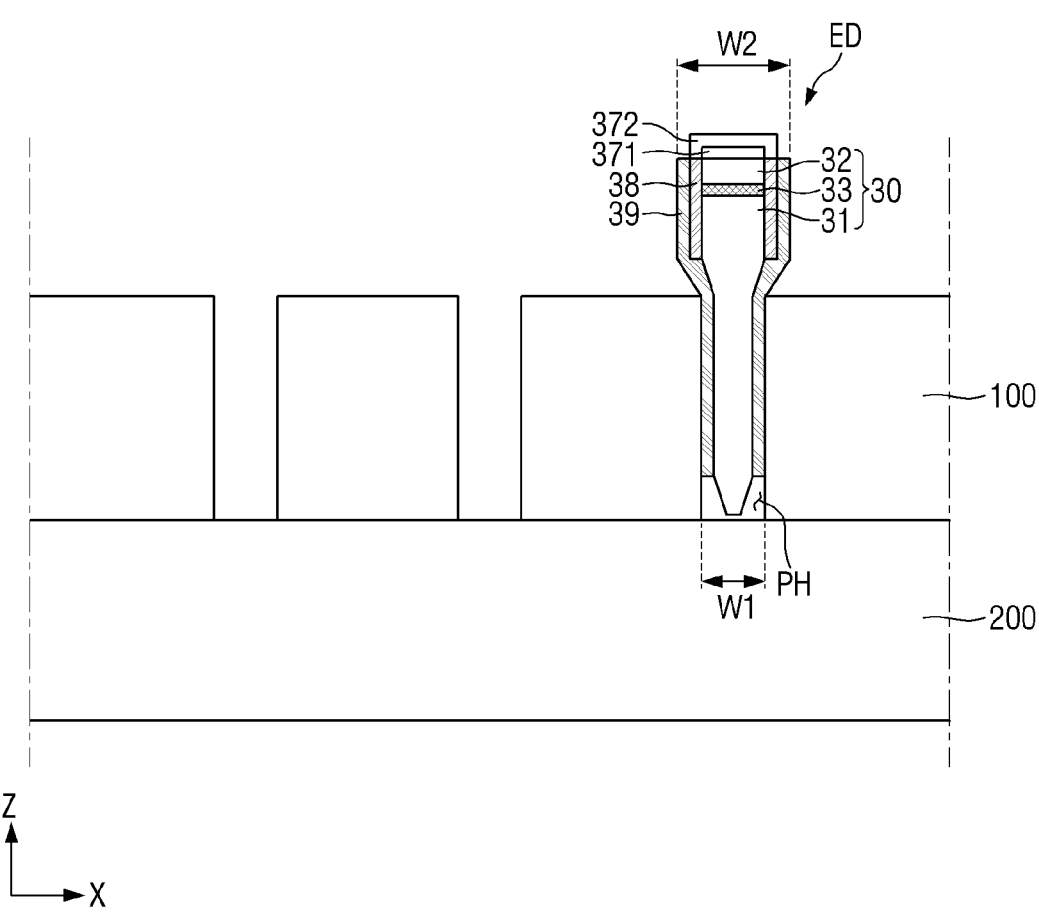

Referring to FIGS. 11 and 12, the light-emitting elements ED may be aligned in the holes PH of the substrate 100. Once the light-emitting elements ED are aligned, the ink 150 may be cleaned out.

The ink 150 containing the light-emitting elements ED may be applied onto the upper surface of the substrate 100. When the ink 150 containing the light-emitting elements ED is applied on the upper surface of the substrate 100, a pressure difference between the upper side and the lower side of the substrate 100 may be formed, so that the ink 150 may be moved to the lower side of the substrate 100 through the holes PH. If the pressure P2 on the lower side of the substrate 100 is less than the pressure P1 on the upper side of the substrate 100, the ink 150 located on the upper side of the substrate 100 may move to the lower side of the substrate 100 through the holes PH. For example, a fluid flow in the first direction D1 may be created in the ink 150. Accordingly, the ink 150 may pass through the holes PH, and the light-emitting elements ED included in the ink 150 may also move together with the ink 150 and may be inserted into the holes PH.

According to an embodiment of the disclosure, widths of ends of the light-emitting elements ED may be different, and thus the light-emitting elements ED may have a biased directivity that allows the light-emitting elements ED to be biased in a desired direction when they are inserted into the holes PH. If there is a fluid flow in the ink 150 in the first direction D1, the light-emitting elements ED may be aligned such that a part having a larger surface area faces in the opposite direction to the fluid flow. For example, an end of each of the light-emitting elements ED adjacent to the second electrode layer 372 may have a larger surface area than another end thereof adjacent to the first semiconductor layer 31. Since the surface area of the end of each of the light-emitting elements ED is greater than that of the another end, the light-emitting elements ED may move in the second direction D2 opposite to the first direction D1. Accordingly, the light-emitting elements ED may be inserted into the holes PH such that the second electrode layer 372 faces the upper surface of the substrate 100 and the first semiconductor layer 31 faces the lower surface of the substrate 100.

An end that is an upper surface of the second electrode layer 372 of the inserted light-emitting element ED may protrude from the upper side of the substrate 100, and another end that is a lower surface of the first semiconductor layer 31 may be disposed in the holes PH of the substrate 100. The first portion S2 and the second portion S2 of the first semiconductor layer 31, the emissive layer 33, the second semiconductor layer 32, the first electrode layer 371 and the second electrode layer 372 of the light-emitting element ED may protrude outward from the upper surface of the substrate 100.

Subsequently, after the light-emitting elements ED have been aligned, the ink 150 applied onto the substrate 100 may be cleaned out for a subsequent process.

Figure 13:
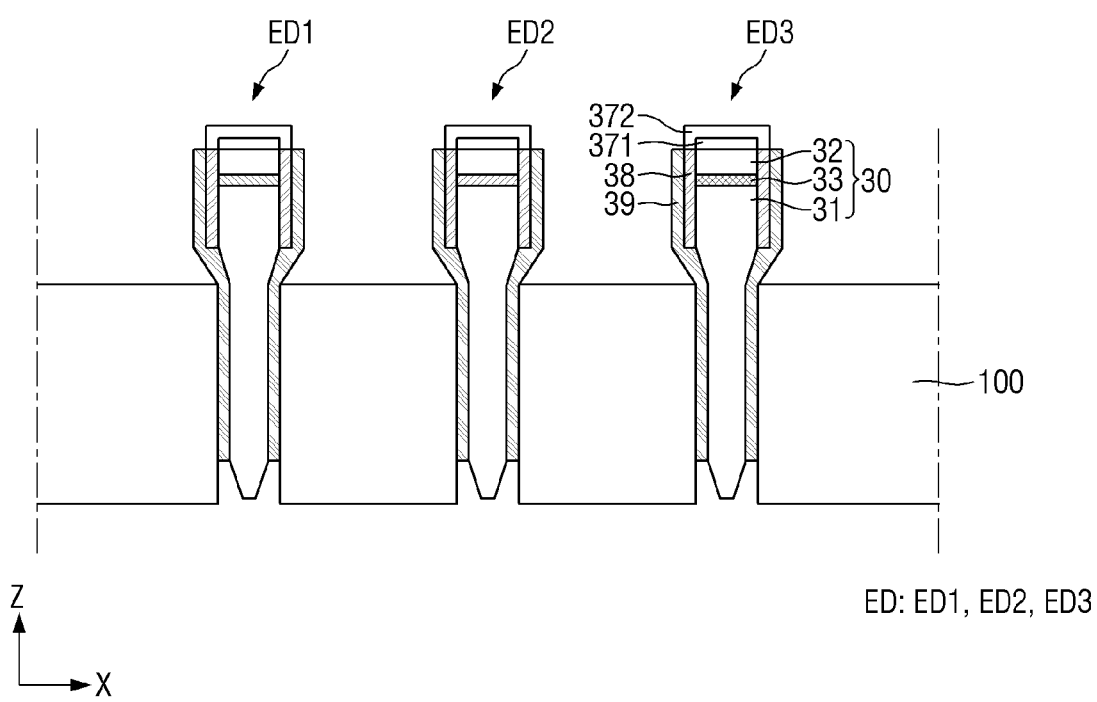

Referring to FIG. 13, the light-emitting elements ED1, ED2 and ED3 emitting different lights may be inserted into the substrate 100 in the same manner as in the processes of FIGS. 11 and 12.

The light-emitting elements ED according to an embodiment may be accurately aligned in the substrate 100 with a particular directionality. As a result, an accuracy and speed of a process of fabricating the display substrate 2000 including the light-emitting elements ED may be improved.

Since the emissive layers 33 of the light-emitting elements ED are larger than the width of the holes PH, it is possible to obtain an emission area for improving light-emitting efficiency.

Figure 14:
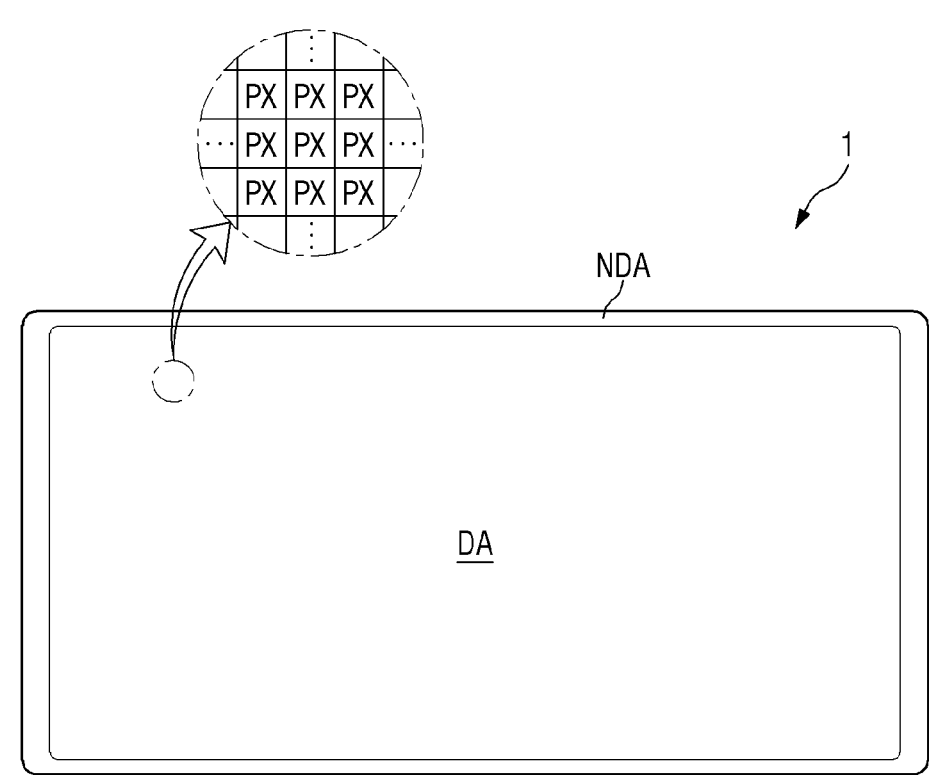
FIG. 14 is a schematic plan view of a display device according to an embodiment of the disclosure.
Figure 14:
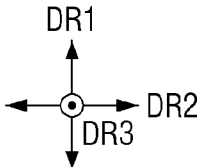

FIG. 14 is a schematic plan view of a display device according to an embodiment of the disclosure.

Referring to FIG. 14, a display device 1 may display a moving image or a still image. A display device 1 may refer to any electronic device that provides a display screen. For example, the display device 1 may include a television set, a laptop computer, a monitor, an electronic billboard, Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, or the like.

The display device 1 may include a display panel for providing a display screen. Examples of the display panel may include an inorganic light-emitting diode display panel, an organic light-emitting display panel, a quantum-dot light-emitting display panel, a plasma display panel, a field emission display panel, or the like. In the following description, a display panel including the above-described light-emitting element ED, for example, an inorganic light-emitting diode may be employed as an example of the display panel, but the disclosure is not limited thereto. Any other display panel may be employed as long as the technical idea of the disclosure may be equally applied.

A first direction DR1, a second direction DR2 and a third direction DR3 are defined in the drawings. The display device 1 according to the embodiments of the disclosure will be described with reference to the drawings. The first direction DR1 may be perpendicular to the second direction DR2 in a plane The third direction DR3 may be perpendicular to the plane where the first direction DR1 and the second direction DR2 are located. The third direction DR3 may be perpendicular to each of the first direction DR1 and the second direction DR2. In the following description of the display devices 1 according to the embodiments of the disclosure, the third direction DR3 refers to a thickness direction of the display device 1.

The display device 1 may have a rectangular shape including shorter sides in the first direction DR1 and longer sides in the second direction DR2 when viewed from the top. Although the corners where the longer sides and the shorter sides of the display device 1 are connected to each other may form a right angle, this is merely illustrative. The display device 1 may have rounded corners. The shape of the display device 1 is not limited to that shown but may be modified in a variety of ways. For example, the display device 1 may have other shapes such as a square, a rectangle with rounded corners (vertices), other polygons a circle, or the like.

A display surface may be located on a side of the display device 1 in the third direction DR3, i.e., the thickness direction. In the following description, the upper side of the display device 1 refers to the side in the third direction DR3 where images are displayed, and the upper surface of the display device 10 refers to the surface facing the side in the third direction DR3, unless specifically stated otherwise. The lower portion refers to the opposite side in the third direction DR3, and likewise the lower surface refers to a surface facing the opposite side in the third direction DR3.

The display device 1 may include the display area DA and a non-display area NDA. In the display area DPA, images may be displayed. In the non-display area NDA, images may not be displayed.

The shape of the display area DA may follow the shape of the display device 1. For example, the shape of the display area DA may have a rectangular shape generally similar to the shape of the display device 1 when viewed from the top. The display area DA may generally occupy a center of the display device 1.

The display area DA may include pixels PX. The pixels PX may be arranged in a matrix. The shape of each of the pixels PX may be rectangular or square when viewed from the top. It is, however, to be understood that the disclosure is not limited thereto. The shape of each of the pixels PX may have a diamond shape having the sides inclined with respect to a direction. The pixels PX may be arranged in stripes or the PenTile® pattern alternately.

The non-display areas NDA may be disposed around the display area DA. The non-display area NDA may surround the display area DA entirely or partially. According to an embodiment of the disclosure, the display area DA may have a rectangular shape, and the non-display areas NDA may be disposed to be adjacent to the four sides of the display area DA. The non-display area NDA may form the bezel of the display device 1. Lines, circuit drivers included in the display device 1, or pad areas on which external devices are mounted may be disposed in the non-display areas NDA.

Figure 15:
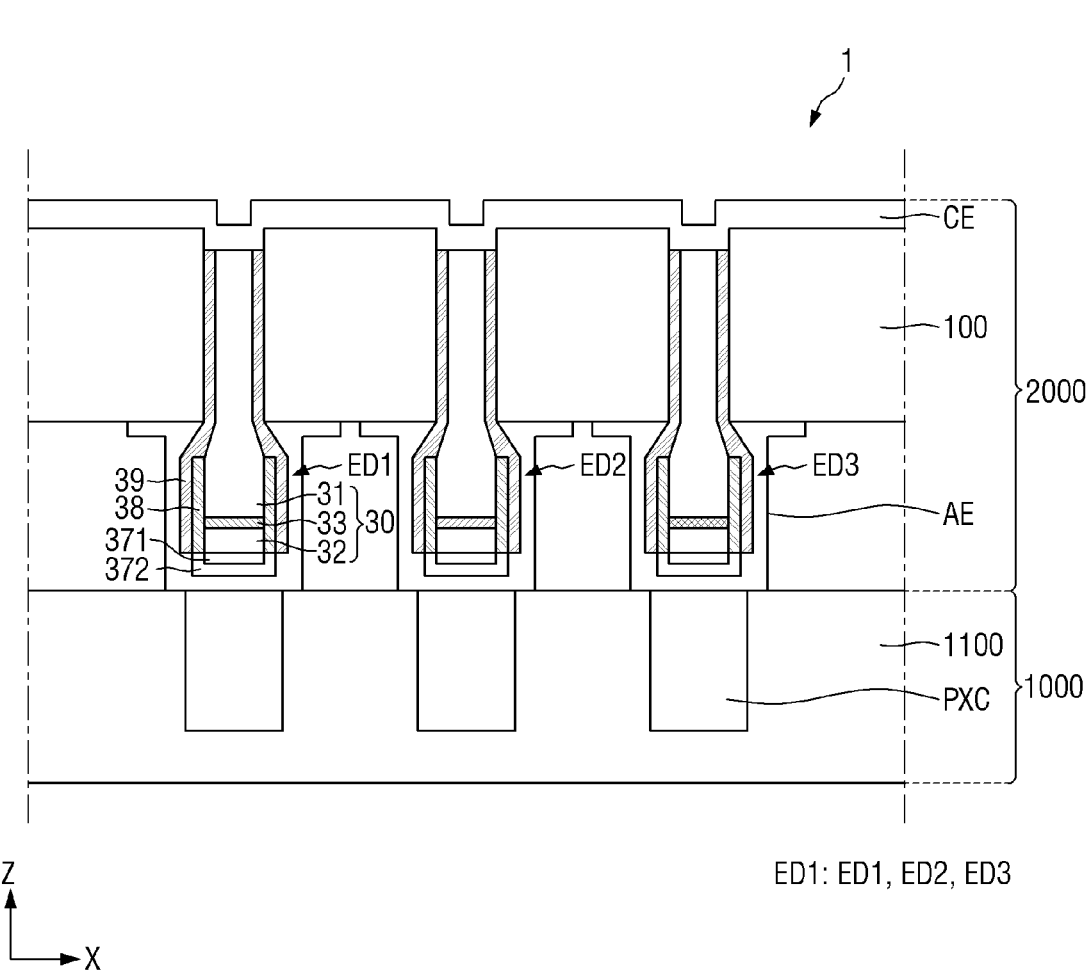
FIG. 15 is a schematic cross-sectional view showing a pixel of a display device according to an embodiment of the disclosure.

FIG. 15 is a schematic cross-sectional view showing a pixel of a display device according to an embodiment of the disclosure.

Referring to FIG. 15, a display device 1 according to an embodiment may include a semiconductor circuit board 1000 and a display substrate 2000. The above-described display substrate 2000 may be attached to the semiconductor circuit substrate 1000 to form the display device 1.

The semiconductor circuit board 1000 may include a first substrate 1100 and pixel circuits units PXC. The display substrate 2000 may include the light-emitting elements ED, the substrate 100, the pixel electrodes AE, and the common electrode CE. A space may be formed between the semiconductor circuit board 1000 and the display substrate 2000 of the display device 1.

The first substrate 1100 may be a silicon wafer substrate. The first substrate 1100 may be made of monocrystalline silicon.

Each of the pixel circuits PXC may be disposed on the first substrate 1100. Each of the pixel circuits PXC may include a complementary metal-oxide semiconductor (CMOS) circuit formed using a semiconductor process. Each of the pixel circuits PXC may include at least one transistor formed via a semiconductor process. Each of the pixel circuits PXC may further include at least one capacitor formed via a semiconductor process.

The pixel circuits PXC may be disposed in the display area DA. Among the pixel circuits PXC, the pixel circuits PXC disposed in the display area DA may be electrically connected to the pixel electrodes AE. For example the pixel circuits PXC and pixel electrodes AE may be connected in a one-to-one correspondence. Each of the pixel circuits PXC may apply an anode voltage to the pixel electrode AE.

At least some of the pixel circuits PXC disposed in the non-display area NDA may apply a cathode voltage to the common electrode CE.

The light-emitting elements ED of the display device 1 may receive the electric signal and emit light by combining holes and electrons with each other.

Figure 16:
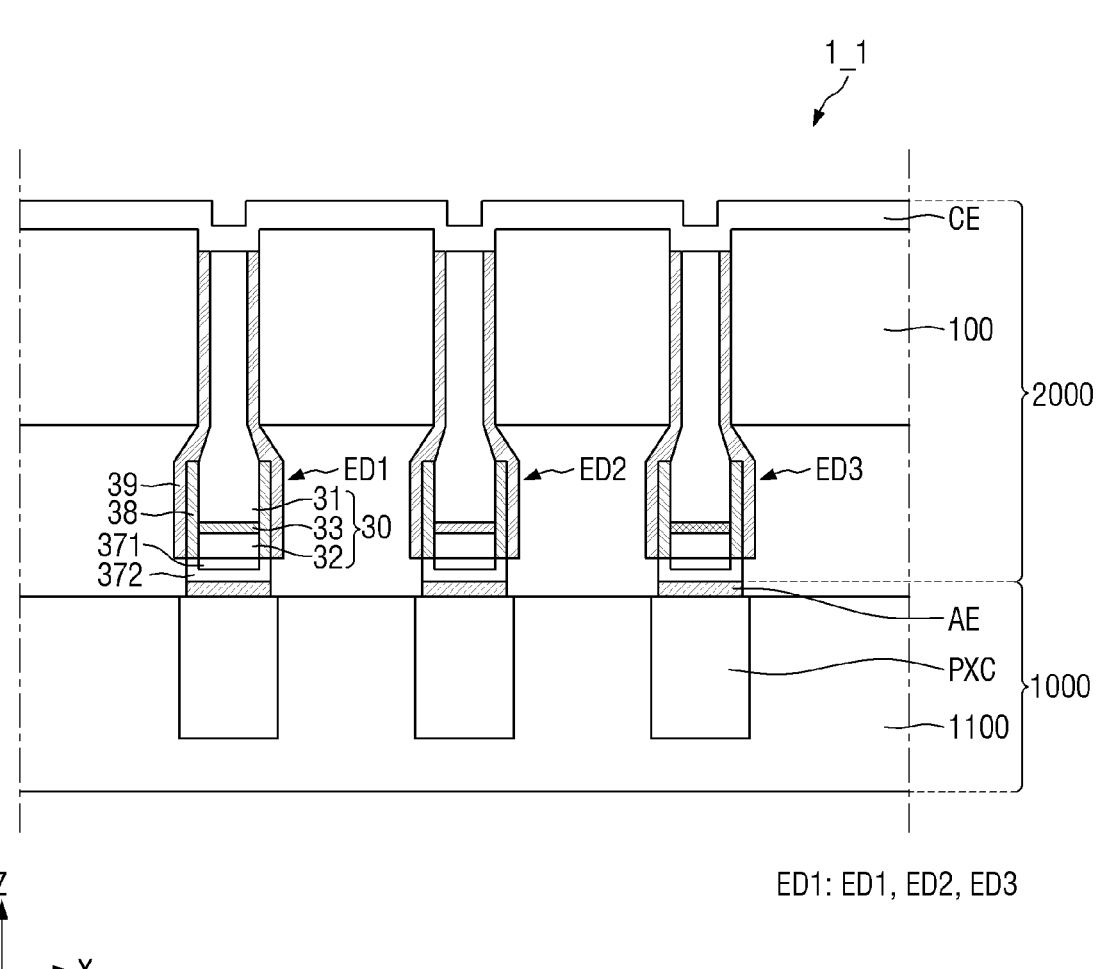
FIG. 16 is a schematic cross-sectional view showing a pixel of a display device according to another embodiment of the disclosure.

FIG. 16 is a cross-sectional view showing a pixel of a display device according to another embodiment of the disclosure.

This embodiment may be different from the above-described embodiment in that a display device 1_1 includes a semiconductor circuit board 1000 in which pixel electrodes AE and pixel circuits PXC are formed integrally.

The semiconductor circuit board 1000 may include pixel circuits PXC associated with pixel electrodes AE and each of the pixel electrodes AE may protrude from the upper surface of the one of the pixel circuits PXC. In this instance, the second electrode layer 372 of the display substrate 2000 may be aligned with the pixel electrodes AE. The pixel electrodes AE may be connected to the second electrode layers 372 to apply an electrical signal.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light-emitting element comprising:
   a core comprising:
      a first semiconductor layer including a first portion and a second portion, the first and second portions having side surfaces at different inclinations;
      a second semiconductor layer disposed on the first semiconductor layer; and
      an emissive layer disposed between the first semiconductor layer and the second semiconductor layer;
   a first insulating layer surrounding, and directly contacting, the first portion of the first semiconductor layer; and
   a second insulating layer surrounding, and directly contacting the second portion of the first semiconductor layer.

2. The light-emitting element of claim 1, wherein
   the core is extended in a direction,
   the first portion of the first semiconductor layer is extended parallel to the direction, and
   the second portion of the first semiconductor layer is inclined with respect to the direction.

3. The light-emitting element of claim 1, wherein the second insulating layer surrounds an outer surface of the first insulating layer.

4. The light-emitting element of claim 1, wherein an inclination of a side surface of the second portion of the first semiconductor layer is smaller than an inclination of a side surface of the first portion.

5. The light-emitting element of claim 1, wherein a minimum diameter of the second portion of the first semiconductor layer is smaller than a minimum diameter of the first portion.

6. The light-emitting element of claim 1, wherein
   the second insulating layer further surrounds the first portion of the first semiconductor layer, and
   an inclination of a side surface of the second insulating layer disposed on the first portion is greater than an inclination of a side surface of the second insulating layer disposed on the second portion.

7. The light-emitting element of claim 1, wherein
   the first semiconductor layer further comprises a third portion and a fourth portion having side surfaces at different inclinations, and the second insulating layer surrounds the third portion of the first semiconductor layer.

8. The light-emitting element of claim 7, wherein an inclination of a side surface of the fourth portion of the first semiconductor layer is smaller than an inclination of a side surface of the third portion.

9. The light-emitting element of claim 7, wherein a minimum diameter of the fourth portion of the first semiconductor layer is smaller than a minimum diameter of the third portion.

10. The light-emitting element of claim 1, further comprising:
   a first element electrode disposed on the second semiconductor layer; and
   a second element electrode surrounding an upper surface and an outer surface of the first element electrode.

11. The light-emitting element of claim 10, wherein a diameter of the second element electrode is substantially equal to a diameter of the first insulating layer.

12. The light-emitting element of claim 1, wherein an end of the first semiconductor layer has a truncated cone shape.

13. The light-emitting element of claim 1, wherein an end of the first semiconductor layer has a cylindrical shape.

14. A display device comprising:
   a substrate having holes;
   a first light-emitting element partially disposed in the substrate and comprising:
      a first semiconductor layer;
      a second semiconductor layer disposed on the first semiconductor layer; and
      an emissive layer disposed between the first semiconductor layer and the second semiconductor layer;
   a common electrode on a first side of the substrate and electrically connected to a plurality of light-emitting elements, including to the first semiconductor layer of the first light-emitting element; and
   a pixel electrode on an opposite second side of the substrate and electrically connected to the second semiconductor layer,
   wherein the first light-emitting element comprises an end protruding from the second side of the substrate, and
   wherein a diameter of the end of the first light-emitting element is greater than a diameter of another end of the first light-emitting element located in the substrate.

* * * * *